US008810440B2

(12) United States Patent
Wu et al.

(10) Patent No.: US 8,810,440 B2
(45) Date of Patent: Aug. 19, 2014

(54) STOCHASTIC TIME-DIGITAL CONVERTER

(75) Inventors: Jianhui Wu, Jiangsu (CN); Zixuan Wang, Jiangsu (CN); Xiao Shi, Jiangsu (CN); Meng Zhang, Jiangsu (CN); Cheng Huang, Jiangsu (CN); Chao Chen, Jiangsu (CN); Fuqing Huang, Jiangsu (CN); Xincun Ji, Jiangsu (CN); Ping Jiang, Jiangsu (CN)

(73) Assignee: Southeast University, Jiangsu (CN)

( * ) Notice: Subject to any disclaimer, the term of this patent is extended or adjusted under 35 U.S.C. 154(b) by 0 days.

(21) Appl. No.: 13/983,297

(22) PCT Filed: May 29, 2012

(86) PCT No.: PCT/CN2012/076202

§ 371 (c)(1),
(2), (4) Date: Aug. 1, 2013

(87) PCT Pub. No.: WO2013/007137

PCT Pub. Date: Jan. 17, 2013

(65) Prior Publication Data

US 2013/0307711 A1  Nov. 21, 2013

(30) Foreign Application Priority Data

Jul. 8, 2011 (CN) .......................... 2011 1 0191203

(51) Int. Cl.
*H03M 1/04* (2006.01)
*G04F 10/00* (2006.01)

(52) U.S. Cl.
CPC ..................................... *H03M 1/04* (2013.01);
*G04F 10/005* (2013.01)
USPC ........... 341/109; 327/156; 327/158; 327/159; 327/269; 375/219; 375/316; 341/125; 341/133; 341/140

(58) Field of Classification Search
CPC ........... H03M 1/02; H03M 1/04; H03M 1/82; H03M 1/109; H03M 3/454; H03M 3/458; G04F 10/005; G04F 10/06; H03L 7/091; H03L 7/085; H03L 7/093; H03L 7/099; H03L 7/304; H03L 7/08; H03L 7/06; H03L 2207/50; H03K 5/13
USPC ........... 341/109–155; 375/219, 316; 327/156, 327/158, 159, 269
See application file for complete search history.

(56) References Cited

U.S. PATENT DOCUMENTS 6,999,013 B1 * 2/2006 Roo et al. ...................... 341/138
7,522,084 B2 * 4/2009 Huang et al. .................. 341/157

(Continued)

FOREIGN PATENT DOCUMENTS

CN  101231310 A  7/2008
CN  101431334 A  5/2009

(Continued)

*Primary Examiner* — Lam T Mai
(74) *Attorney, Agent, or Firm* — Christensen Fonder P.A.

(57) ABSTRACT

A stochastic time-digital converter (STDC) including an input switching circuit, an STDC array, and an encoder. A clock circuit inputs two clock signals into two input terminals of the input switching circuit; the input switching circuit transmits the two clock signals in a cyclic cross-transposition form to two input terminals of the STDC array, and simultaneously outputs a trigger control signal to the encoder; each comparator in the STDC array independently judges the speeds of the two clock signals and sends the judgement results to the encoder for collection and processing; and the encoder outputs the size and positivity or negativity of the phase difference of the two clock signals. The technical solution utilizes the stochastic characteristic of the STDC to double the number of the equivalent comparators in the STDC array, eliminating the effects on the circuitry of device mismatching and processes, power supply voltage, and temperature.

4 Claims, 3 Drawing Sheets

(56) References Cited

U.S. PATENT DOCUMENTS

| | | | |
|---|---|---|---|
| 7,859,442 B2 * | 12/2010 | Daniels et al. | 341/143 |
| 8,344,918 B2 * | 1/2013 | Baudin et al. | 341/115 |
| 8,384,575 B1 * | 2/2013 | Braswell | 341/143 |
| 8,421,661 B1 * | 4/2013 | Jee et al. | 341/143 |
| 8,446,302 B2 * | 5/2013 | Miyashita | 341/111 |
| 8,618,967 B2 * | 12/2013 | Nikaeen et al. | 341/143 |
| 2008/0129279 A1 | 6/2008 | Gallavan | |
| 2012/0019296 A1 | 1/2012 | Pavlovic et al. | |

FOREIGN PATENT DOCUMENTS

| | | |
|---|---|---|
| CN | 102113206 A | 6/2011 |
| CN | 102291138 A | 12/2011 |
| CN | 202135115 U | 2/2012 |

\* cited by examiner

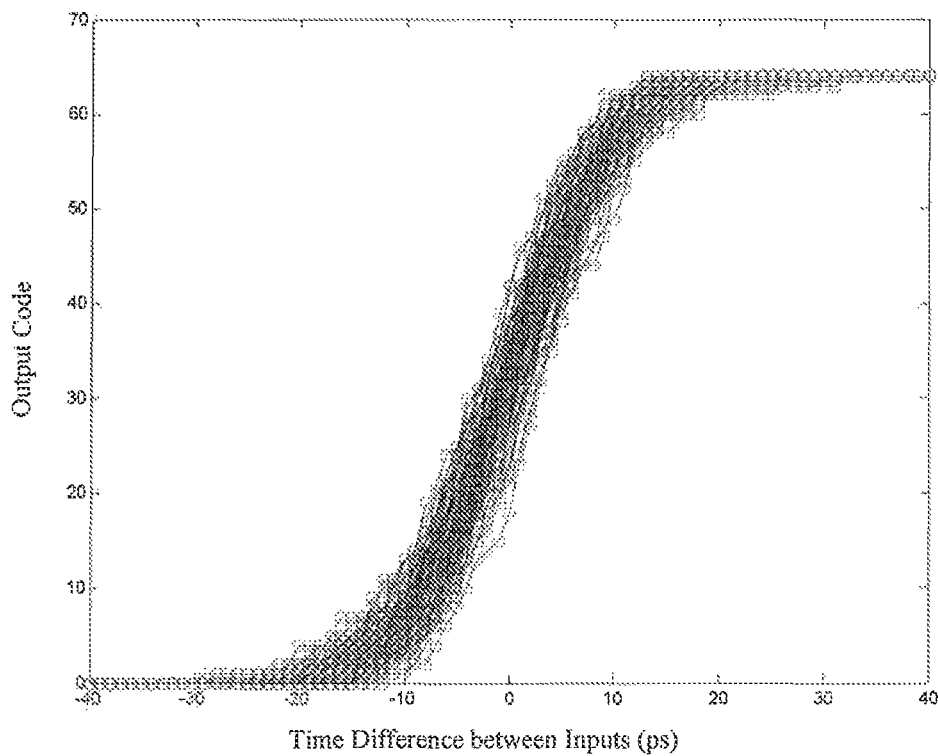
Figure 4-a
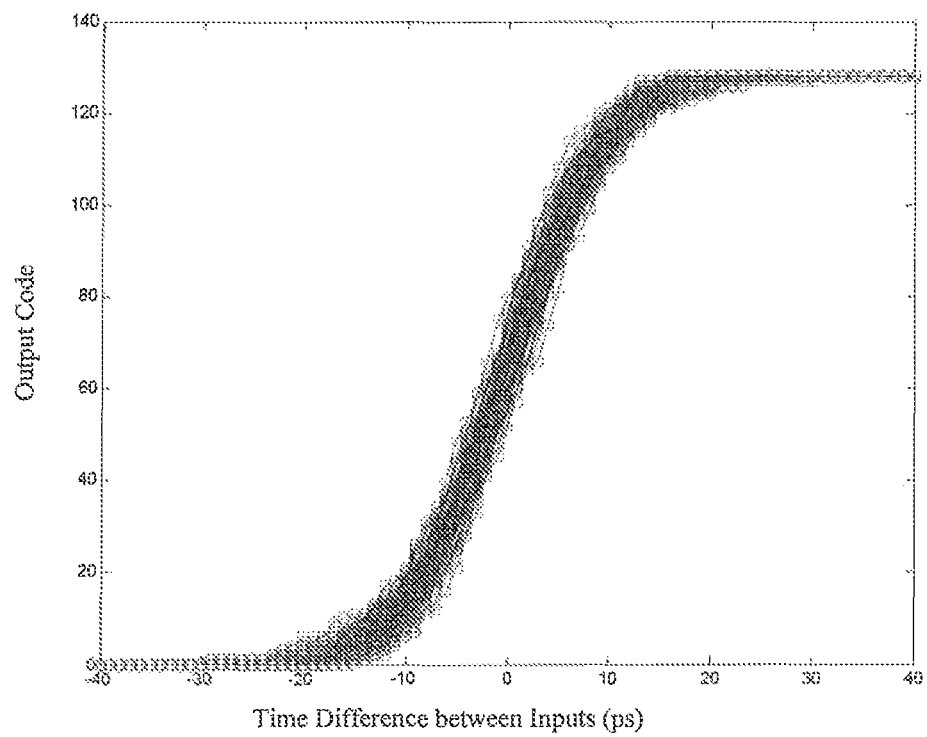
Figure 4-b

STOCHASTIC TIME-DIGITAL CONVERTER

PRIORITY CLAIM

The present application is a National Phase entry of PCT Application No. PCT/CN2012/076202, filed May 29, 2012, which claims priority from Chinese Application Number 201110191203.X, filed Jul. 8, 2011, the disclosures of which are hereby incorporated by reference herein in their entirety.

FIELD OF THE INVENTION

The present invention relates to a stochastic time-digital converter that contains an input switching circuit and can discriminate the time difference between the rising edges of two clock signals and present the time difference in a digital form.

BACKGROUND OF THE INVENTION

A Time-Digital Converter (TDC) is widely applied in integrated circuits and mainly used to provide phase discrimination for a digital phase-locked loop (DPLL). In addition, in many application scenarios, such as nuclear medicine imaging, laser ranging, and half life testing of particles in high energy physics, etc., a TDC is used to discriminate minute time (phase) differences. A TDC is implemented with full digital technology, and has good portability as the size is decreased. Moreover, full digital TDC circuits have better noise immunity and lower power consumption. Both the discrimination accuracy and the lock time of TDCs are greatly improved compared with conventional frequency and phase discriminators, since TDCs quantize time (phase) differences into digital outputs.

A TDC is a time (phase) difference discrimination circuit which replaces conventional phase discriminators. In DPLL, the digital control words output by a TDC reflects the time difference between the rising edges of two input signals and directly drives the oscillator to adjust the frequency. Therefore, the requirement for discrimination accuracy of a TDC is very high. One common structure is a delay line TDC, in which a delay line is composed of a series of inverters with very low delay through series connections, wherein, one input signal is transmitted through the delay line, and is compared with another input signal after passing each stage of delay, so as to discriminate the time difference between the rising edges of the two signals. The resolution of a TDC with such a structure is equal to the delay time in each stage of delayer, and therefore highly depends on the manufacturing technology; meanwhile, the deviation is severe, and further improvement of resolution is limited.

Another implementation structure is a stochastic time-digital converter (STDC). In case the phases of two signals are close to each other, the judgment of the comparator may have indeterminacy, owing to the influence of PVT and mismatch of components. The error resulting from the indeterminacy follows Gaussian distribution. A number of identical comparators can be used to form an array, and the output from the comparators can be collected and analyzed, and thereby the information of the signal phase difference can be obtained. Such a structure can achieve very fine resolution and is highly tolerant to PVT. However, since the achievable resolution is directly related with the number of used comparators, a large number of comparators are required to improve the resolution; as a result, the power consumption, area and hardware cost will be inevitably increased.

SUMMARY OF THE INVENTION

Technical Problem

To overcome the drawbacks in the prior art, the present invention provides a STDC that employs automatic input switching technology and contains an input switching circuit.

Technical Solution

An embodiment of the invention comprises a stochastic time-digital converter (STDC), comprising an STDC array and an encoder, as well as an input switching circuit, wherein, a clock circuit inputs two clock signals into two input terminals of the input switching circuit respectively, the input switching circuit feeds the two clock signals input from the clock circuit into two input terminals of the STDC array in an interleaving manner, and outputs a trigger control signal to the encoder at the same time; each comparator in the STDC array judges the speeds of the two clock signals separately, and sends the judgment result to the encoder for treatment; the encoder outputs the magnitude and positive/negative of the phase difference between the two clock signals.

Moreover, in the STDC provided in the present invention, the input switching circuit comprises one D flip-flop, four AND gates, and two OR gates, wherein,
  the first clock signal is connected to the clock terminal of the D flip-flop, the second input terminal of the second AND gate, and the second input terminal of the third AND gate respectively; the trigger signal output terminal of the D flip-flop is connected to the first input terminal of the first AND gate, the first input terminal of the third AND gate, and the first input terminal of the encoder respectively, and the trigger signal output by the D flip-flop is subjected to primary phase inversion and then connected to the D input terminal of the D flip-flop, the first input terminal of the second AND gate, and the first input terminal of the fourth AND gate respectively;
  the second clock signal is connected to the second input terminal of the first AND gate and the second input terminal of the fourth AND gate respectively;
  the output terminal of the first AND gate and the output terminal of the second AND gate are connected to the input terminal of the first OR gate, and the output terminal of the third AND gate and the output terminal of the fourth AND gate are connected to the input terminal of the second OR gate; the output terminal of the first OR gate and the output terminal of the second OR gate are used as the first output terminal and the second output terminal of the input switching circuit respectively.

Moreover, in an embodiment of the STDC provided in the present invention, the STDC array is composed of 64 identical comparator units, and each comparator unit employs a structure of a conventional differential comparator cascaded with an RS latch.

Moreover, in an embodiment of the STDC provided in the present invention, the encoder is a 64-in/7-out encoder.

Beneficial Effects

In the present invention, an input switching circuit is added at the input terminal of the STDC to switch the rising edges of two input signals in alternate and drive the STDC, so that the two input signals are connected to the input terminal of the comparator in alternate; as a result, the influences of component mismatch, process, supply voltage, and temperature (PVT) on the circuit are minimized; in addition, the stochastic behavior of the comparators are fully utilized, so that the number of equivalent comparators in the STDC is doubled. To attain the same resolution, the number of used comparators in the STDC is halved, and thereby the hardware cost, power consumption, and area are also halved.

BRIEF DESCRIPTION OF THE DRAWINGS

FIG. 4 shows the comparison of transmission characteristics between the STDC provided in the present invention and a conventional STDC, wherein, FIG. 4-a is a diagram of transmission characteristics of a conventional STDC, and FIG. 4-b is a diagram of transmission characteristics of the STDC provided in the present invention;

In the figures, clk1: first clock signal, clk2: second clock signal, sw: trigger signal, out1: first output terminal of input switching circuit, out2: second output terminal of input switching circuit, AND1: first AND gate, AND2: second AND gate, AND3: third AND gate, AND4: fourth AND gate, OR1: first OR gate, OR2: second OR gate.

DETAILED DESCRIPTION

Hereunder the technical scheme of the present invention will be further detailed, with reference to the accompanying drawings.

Figure 1:
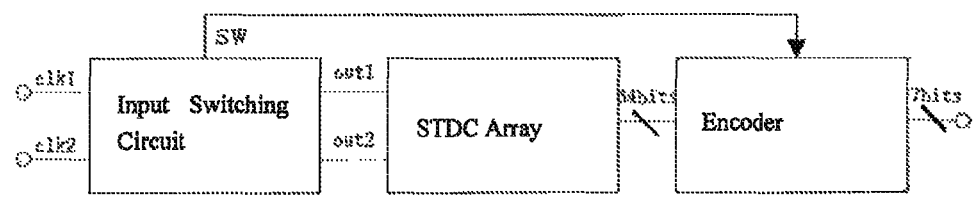
FIG. 1 is a circuit block diagram of the main part of STDC in the present invention.

As shown in FIG. 1, the STDC comprises an input switching circuit, an STDC array, and an encoder, wherein, the input switching circuit is implemented with a digital logic circuit, the STDC array is composed of 64 identical comparator units, and the encoder is a 64-7 encoder controlled by sw signal. Two clock input signals clk1 and clk2 are connected to the input terminals of the input switching circuit, the outputs out1 and out2 of the input switching circuit are connected to the input terminal of each comparator in the STDC array respectively, the output signal sw is connected to the encoder and serves as a control signal, which is a frequency-halving signal triggered by the falling edge of clk1. The 64-bit judgment result produced by STDC is connected to the encoder, which generates a 7-bit output.

Figure 2:
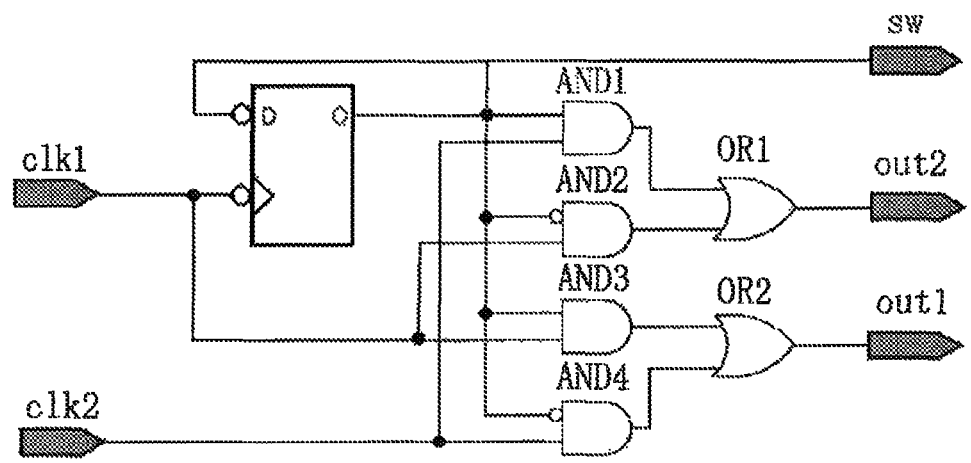
FIG. 2 is a schematic diagram of the gate level circuit of the input switching circuit in the present invention.

As shown in FIG. 2, the input switching circuit is implemented with a digital logic circuit, and comprises a D flip-flop that is triggered by falling edge, four AND gates, and two OR gates. The STDC array is composed of 64 identical comparator units, which employ a structure of a conventional differential comparator cascaded with an RS latch.

The main part of the input switching circuit is composed of a D flip-flop that is triggered by falling edge, four AND gates (AND1, AND2, AND3, AND4), and two OR gates (OR1, OR2). Clk1 is connected to the clock terminal of the D flip-flop, the output sw is connected to one input terminal of the AND1 and one input terminal of the AND3 respectively, and then connected via an inverter to the D input terminal of the D flip-flop, one input terminal of the AND2, and one input terminal of the AND4. The clock signal clk1 is connected to the other input terminal of the AND2 and the other input terminal of the AND3, and clk2 is connected to the other input terminal of the AND1 and the other input terminal of the AND4. The outputs from the AND1 and AND2 are connected to the input of the OR1, and the outputs of the AND3 and AND4 are connected to the input of the OR2. The outputs of OR1 and OR2 are used as the outputs out2 and out1 of the entire input switching circuit respectively.

Figure 3:
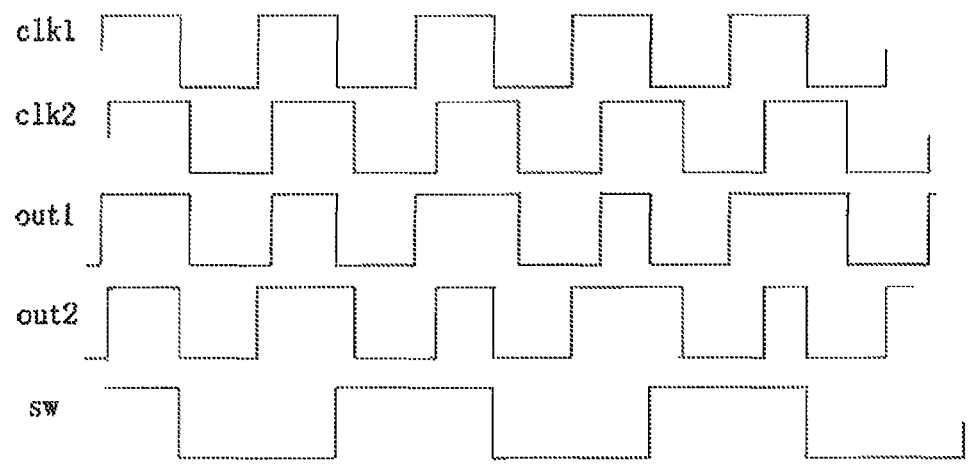
FIG. 3 is a behavior simulation diagram of the input switching circuit in the present invention.

FIG. 3 is a behavior simulation diagram of the input switching circuit in the present invention. As can be seen from the diagram, when sw is 1, the rising edge of the output out1 is aligned with the rising edge of the input clk1, and the rising edge of the output out2 is aligned with the rising edge of the input clk2; when sw is 0, the rising edge of the output out1 is aligned with the rising edge of the input clk2, and the rising edge of the output out2 is aligned with the rising edge of the input clk1, so that the rising edges of the inputs are switched in alternate.

FIG. 4 shows the comparison of transmission characteristics between the STDC provided in the present invention and a conventional STDC, wherein, FIG. 4-a is a diagram of transmission characteristics of a conventional STDC, and FIG. 4-b is a diagram of transmission characteristics of the STDC provided in the present invention. As can be seen from the comparison between FIG. 4-a and FIG. 4-b, the two circuits have the same effective discrimination range; however, for an 8×8 comparator array, the conventional STDC can provide 6-bit output only, while the STDC in the present invention can provide a 7-bit output. At the same hardware cost, the STDC in the present invention has higher accuracy. Similarly, to implement 7-bit output accuracy, the STDC in the present invention requires 64 comparators only, while the conventional STDC requires 128 comparators.

Figure 5:
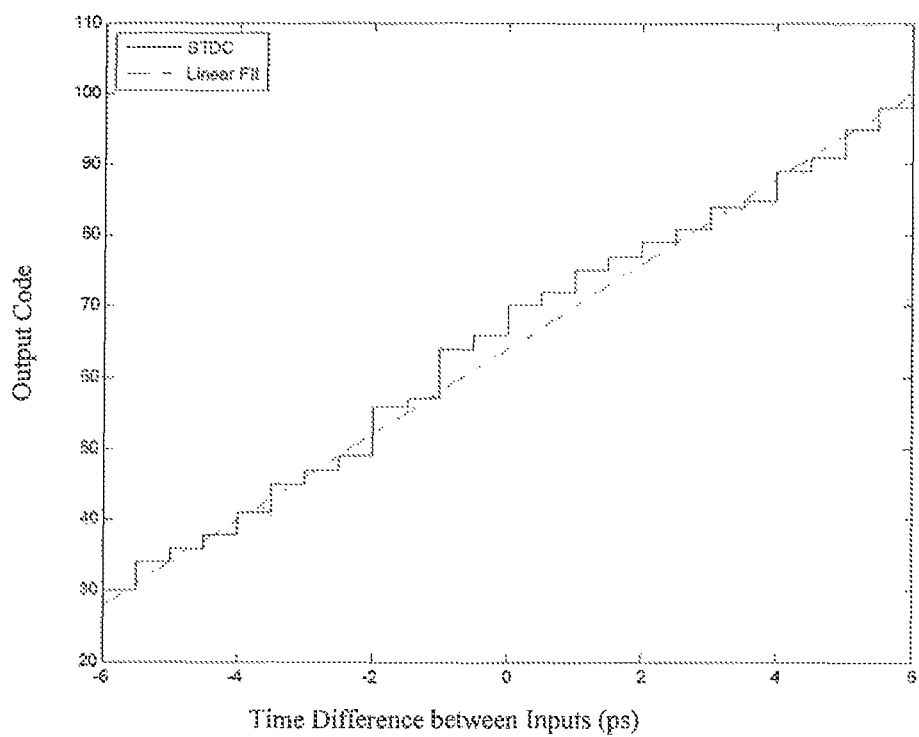
FIG. 5 is a diagram of transmission characteristics in a linear region of the STDC provided in the present invention, wherein, the solid line represents the actual transmission curve of the STDC, and the dotted line represents the ideal transmission curve.

FIG. 5 is a diagram of transmission characteristics in a linear region of the STDC provided in the present invention, wherein, the solid line represents the actual transmission curve of the STDC, and the dotted line represents the ideal transmission curve. As can be seen from the diagram, in the linear region, the transmission curve is essentially linear.

In summary, in the present invention, an input switching circuit is cascaded before the STDC, and the two input signals of the circuit are transmitted to the two input terminals of the STDC in an interleaving manner; each comparator in the STDC judges the speed of the two signals separately, and sends the judgment result to the encoder for treatment. The output from the encoder reflects the magnitude and positive/negative of the phase difference between the two input signals.

According to the working principle of STDC, in order to improve the discrimination resolution, the quantity of comparators has to be increased; as a result, the power consumption and area will be increased inevitably. With an input switching circuit cascaded before the STDC, the two input signals clk1 and clk2 will be output by the two output terminals out1 and out2 in alternate, i.e., if out1 outputs clk1 and out2 outputs clk2 in the present cycle, then out1 will output clk2 and out2 will output clk1 in the next cycle. After such input switching treatment, the influences of components mismatch and PVT on the circuit are greatly inhibited, and therefore the discrimination accuracy is improved. For every two adjacent cycles, the disturbance of non-ideal factors to each comparator is completely different. From the viewpoint of statistics, such an approach is equivalent to the addition of a new independent sample. Therefore, the number of equivalent comparators in the STDC is doubled; in other words, the resolution of the STDC is not reduced if the number of comparators is halved, but the actual hardware cost can be greatly reduced.

While the present invention has been illustrated and described with reference to some preferred embodiments, the present invention is not limited to these embodiments. Those having ordinary skills in the art should recognize that various variations and modifications can be made without departing from the spirit and scope of the present invention as defined by the accompanying claims.

The invention claimed is:

1. A stochastic time-digital converter (STDC), comprising an STDC array, an encoder, and an input switching circuit, wherein, a clock circuit inputs two clock signals into two input terminals of the input switching circuit separately, the input switching circuit feeds the two clock signals input by the clock circuit into two input terminals of the STDC array in an interleaving manner, and outputs a trigger control signal to the encoder at the same time; each comparator in the STDC array judges speeds of the two clock signals separately, and sends a judgment result to the encoder for treatment; the encoder outputs a magnitude and positive/negative of phase difference between the two clock signals.

2. The STDC according to claim 1, wherein, the input switching circuit comprises one D flip-flop, four AND gates, and two OR gates, wherein:

the first clock signal is connected to the clock terminal of the D flip-flop, the second input terminal of the second AND gate, and the second input terminal of the third AND gate, respectively; the trigger signal output terminal of the D flip-flop is connected to the first input terminal of the first AND gate, the first input terminal of the third AND gate, and the first input terminal of the encoder, respectively, and the trigger signal output by the D flip-flop is subjected to primary phase inversion and then connected to the D input terminal of the D flip-flop, the first input terminal of the second AND gate, and the first input terminal of the fourth AND gate respectively;

the second clock signal is connected to the second input terminal of the first AND gate and the second input terminal of the fourth AND gate, respectively; and the output terminal of the first AND gate and the output terminal of the second AND gate are connected to the input terminal of the first OR gate, and the output terminal of the third AND gate and the output terminal of the fourth AND gate are connected to the input terminal of the second OR gate; the output terminal of the first OR gate and the output terminal of the second OR gate are used as the first output terminal and the second output terminal of the input switching circuit respectively.

3. The STDC according to claim 1, wherein, the STDC array is composed of 64 identical comparator units, and each comparator unit employs a structure of a conventional differential comparator cascaded with an RS latch.

4. The STDC according to claim 1, wherein, the encoder is a 64-in/7-out encoder.

* * * * *